(12) United States Patent
Muller et al.

(10) Patent No.: US 8,099,073 B1
(45) Date of Patent: Jan. 17, 2012

(54) NOISE REDUCTION IN AMPLIFIER CIRCUITRY USING SINGLE-SIDEBAND CHOPPER STABILIZATION

(75) Inventors: Paul Muller, Crissier (CH); Thomas Cho, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 818 days.

(21) Appl. No.: 12/124,115

(22) Filed: May 20, 2008

Related U.S. Application Data

(60) Provisional application No. 60/939,478, filed on May 22, 2007.

(51) Int. Cl.
H04B 1/10 (2006.01)
H03F 1/02 (2006.01)

(52) U.S. Cl. ..... 455/296; 455/311; 455/341; 455/114.3; 330/9

(58) Field of Classification Search ............. 455/114.3, 455/296, 303, 311, 341; 330/9, 302, 306
See application file for complete search history.

(56) References Cited

U.S. PATENT DOCUMENTS

| | | | | |
|---|---|---|---|---|
| 3,579,131 | A * | 5/1971 | Fukuda | 330/9 |
| 3,967,204 | A * | 6/1976 | Hansen | 455/306 |
| 4,281,295 | A * | 7/1981 | Nishimura et al. | 333/14 |
| 5,485,121 | A | 1/1996 | Huijsing et al. | |
| 6,262,626 | B1 * | 7/2001 | Bakker et al. | 330/9 |
| 6,307,430 | B1 * | 10/2001 | Thomsen et al. | 330/9 |
| 6,734,723 | B2 * | 5/2004 | Huijsing et al. | 330/9 |
| 6,768,374 | B1 * | 7/2004 | Lee | 330/9 |
| 7,262,654 | B2 * | 8/2007 | Kejariwal et al. | 330/9 |
| 7,292,095 | B2 * | 11/2007 | Burt et al. | 330/9 |
| 7,295,061 | B1 * | 11/2007 | Dasgupta | 330/9 |
| 7,456,684 | B2 * | 11/2008 | Fang et al. | 330/9 |
| 7,518,440 | B1 * | 4/2009 | Trifonov | 330/9 |
| 2008/0269841 | A1 * | 10/2008 | Grevious et al. | 607/60 |

OTHER PUBLICATIONS

Bakker,T., et al. "A CMOS Nested-Chopper Instrumentation Amplifier with 100-nV Offset" *IEEE Journal of solid-state circuits*, vol. 35, No. 12, Dec. 2000 (7 pages).

Burt, R., et al. "A Micropower Chopper-Stabilized Operational Amplifier Using a SC Notch Filter With Synchronous Integration Inside the Continuous-Time Signal Path" *IEEE Journal of solid-state circuits*, vol. 41, No. 12, Dec. 2006 (8 pages).

Enz, C., et al. "Circuit Techniques for Reducing the Effects of Op-Amp Imperfections: Autozeroing, Correlated Double Sampling, and Chopper Stabilization" *Proceedings of the IEEE*, vol. 84, No. 11, Nov. 1996 (31 pages).

Enz, C., et al., "A CMOS Chopper Amplifier" *IEEE Journal of solid-state circuits*, vol. SC-22, No. 3, Jun. 1987 (8 pages).

Eschauzier, R., et al., "A 100-MHz 100-dB Operational Amplifier with Multipath Nested Miller Compensation Structure" *IEEE Journal of solid-state circuits*, vol. 27, No. 12, Dec. 1992 (9 pages).

Ma, D., "RF Receiver Systems and Circuits" *ECE1371 Term Paper* (Printed from http://www.eecg.utoronto.ca/~kphang/ece1371/rfreceiver.pdf, on May 20, 2008) (14 pages).

Witte, J., et al,. "A CMOS Chopper Offset-Stabilized Opamp" *IEEE Journal of solid-state circuits*, vol. 42, No. 7, Jul. 2007 (7 pages).

\* cited by examiner

*Primary Examiner* — Duc M Nguyen

(57) ABSTRACT

A multi-path amplifier can include a high frequency path, a low frequency path, and a summing node to sum an output from the high frequency path with an output from the low frequency path. The low frequency path can include a flicker noise reduction mechanism including an image band rejection mechanism. The low frequency path can include an in-phase path and a quadrature path.

21 Claims, 7 Drawing Sheets

NOISE REDUCTION IN AMPLIFIER CIRCUITRY USING SINGLE-SIDEBAND CHOPPER STABILIZATION

CROSS-REFERENCE TO RELATED APPLICATIONS

This application claims priority to U.S. Provisional Application Ser. No. 60/939,478, titled "Flicker Noise Reduction Technique in the Multi-Path Operational Amplifier Using Single-Sideband Chopper Stabilization Method," filed on May 22, 2007, the disclosure of which is incorporated herein by reference in its entirety.

BACKGROUND

The subject matter of this patent application is generally related to electrical circuits.

Amplifiers can amplify input signals such as signals present in wireless devices. Some input signals can include both high frequency and low frequency components. Other input signals can include only a low frequency component. The offset and flicker noise of an amplifier can corrupt signal content located at low frequencies especially in amplifiers constructed using Complementary Metal-Oxide-Semiconductor (CMOS) technologies.

SUMMARY

This specification describes technologies that, among other things, describe using single-sideband chopper stabilization techniques to reduce noise in amplifier circuitry.

The subject matter described can be implemented in circuitry that includes a high frequency path, a low frequency path, and a summing node. The low frequency path can include a flicker noise reduction mechanism that includes an image band rejection mechanism. The summing node can sum an output from the high frequency path with an output from the low frequency path.

This, and other aspects, can include one or more of the following features. The low frequency path can include an in-phase path and a quadrature path. The in-phase path can include a first amplifier, a first chopper, and a second chopper. The first amplifier can be coupled between the first chopper and the second chopper, and the first and second choppers can use a first chopping signal. The quadrature path can include a second amplifier, a third chopper, and a fourth chopper. The second amplifier can be coupled between the third chopper and the fourth chopper, and the third and fourth choppers can use a second chopping signal that differs from the first chopping signal by a quadrature phase shift. The low frequency path can include a low-pass filter. The high frequency path can include a third amplifier.

The subject matter described also can be implemented in circuitry that includes a signal generator that produces a first chopping signal at a chopping frequency and produces a second chopping signal at the chopping frequency with a quadrature phase-shift; a first chopper unit that modulates an input signal using the first chopping signal to produce an output; a first amplifier unit that amplifies the output of the first chopper unit to produce an output; a second chopper unit that modulates the input signal using the second chopping signal to produce an output; a second amplifier unit that amplifies the output of the second chopper unit to produce an output; a third chopper unit that modulates the output of the first amplifier unit using the first chopping signal to produce an output; a third amplifier unit that amplifies the output of the third chopper unit to produce an output; a fourth chopper unit that modulates the output of the second amplifier unit using the second chopping signal to produce an output; a fourth amplifier unit that amplifies the output of the fourth chopper unit to produce an output; and a first summing node that sums the output of the third amplifier with an inverted form of the output of the fourth amplifier unit.

This, and other aspects, can include one or more of the following features. The circuitry can also include a fifth amplifier unit that amplifies the input signal to produce an output; and a second summing node responsive to the output of the fifth amplifier unit and an output coupled with the first summing node. The circuitry can also include a low pass filter that attenuates frequencies that are at or above an attenuation frequency, wherein the low pass filter is coupled between the first and second summing nodes; and a sixth amplifier unit coupled between the first and second summing nodes. The low pass filter can be coupled between the first summing node and the sixth amplifier unit. The low pass filter can be integrated into the third amplifier and the fourth amplifier.

A wireless system can include a signal interface, a wireless module in communication with the signal interface, and an amplifier circuit in communication with the wireless module. The amplifier circuit can include a high frequency path and a low frequency path, wherein the low frequency path includes a flicker noise reduction mechanism including an image band rejection mechanism, and a summing node to sum an output from the high frequency path with an output from the low frequency path.

This, and other aspects, can include one or more of the following features. The low frequency path can include an in-phase path and a quadrature path. The in-phase path can include a first amplifier, a first chopper, and a second chopper. The first amplifier can be coupled between the first chopper and the second chopper, and the first and second choppers can use a first chopping signal. The quadrature path can include a second amplifier, a third chopper, and a fourth chopper. The second amplifier can be coupled between the third chopper and the fourth chopper, and the third and fourth choppers can use a second chopping signal that differs from the first chopping signal by a quadrature phase shift. The low frequency path can include a low-pass filter. The high frequency path can include a third amplifier. The amplifier circuit can be coupled between the signal interface and the wireless module, wherein the amplifier circuit amplifies a signal received over the signal interface. The amplifier circuit can be integrated with the wireless module. An output of the amplifier circuit can be used by the wireless module to transmit a signal over the signal interface. The amplifier circuit can be integrated with the wireless module.

The subject matter described also can be implemented in methods that include obtaining a signal; generating a first chopping signal at a chopping frequency; generating a second chopping signal at the chopping frequency with a quadrature phase-shift; modulating the signal using the first chopping signal to produce a first modulated signal; modulating the signal using the second chopping signal to produce a second modulated signal; amplifying the first modulated signal to produce a first amplified signal; amplifying the second modulated signal to produce a second amplified signal; modulating the first amplified signal using the first chopping signal to produce a third modulated signal; modulating the second amplified signal using the second chopping signal to produce a fourth modulated signal; and summing the third modulated signal and an inverted form of the fourth modulated signal to produce a first summed signal.

This, and other aspects, can include one or more of the following features. The method can include attenuating frequencies in the first summed signal that are at or above an attenuation frequency to produce a filtered signal. The method also can include amplifying the obtained signal to produce a high frequency signal; and summing the filtered signal with the high frequency signal. The method can include attenuating frequencies, before the summing, in the third modulated signal and the fourth modulated signal that are at or above an attenuation frequency. The method also can include amplifying the obtained signal to produce an amplified high frequency signal; and summing the first summed signal with the amplified high frequency signal. The method also can include summing the first summed signal with the obtained signal to produce an intermediate signal; and amplifying the intermediate signal.

Particular implementations of the subject matter described in this specification can be implemented to realize one or more of the following potential advantages. The described subject matter can be used to amplify an input signal while reducing the effect of amplifier offset and flicker noise. The described subject matter can be used to remove or attenuate image band components at plus or minus multiples of the chopping frequency while amplifying the input signal.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
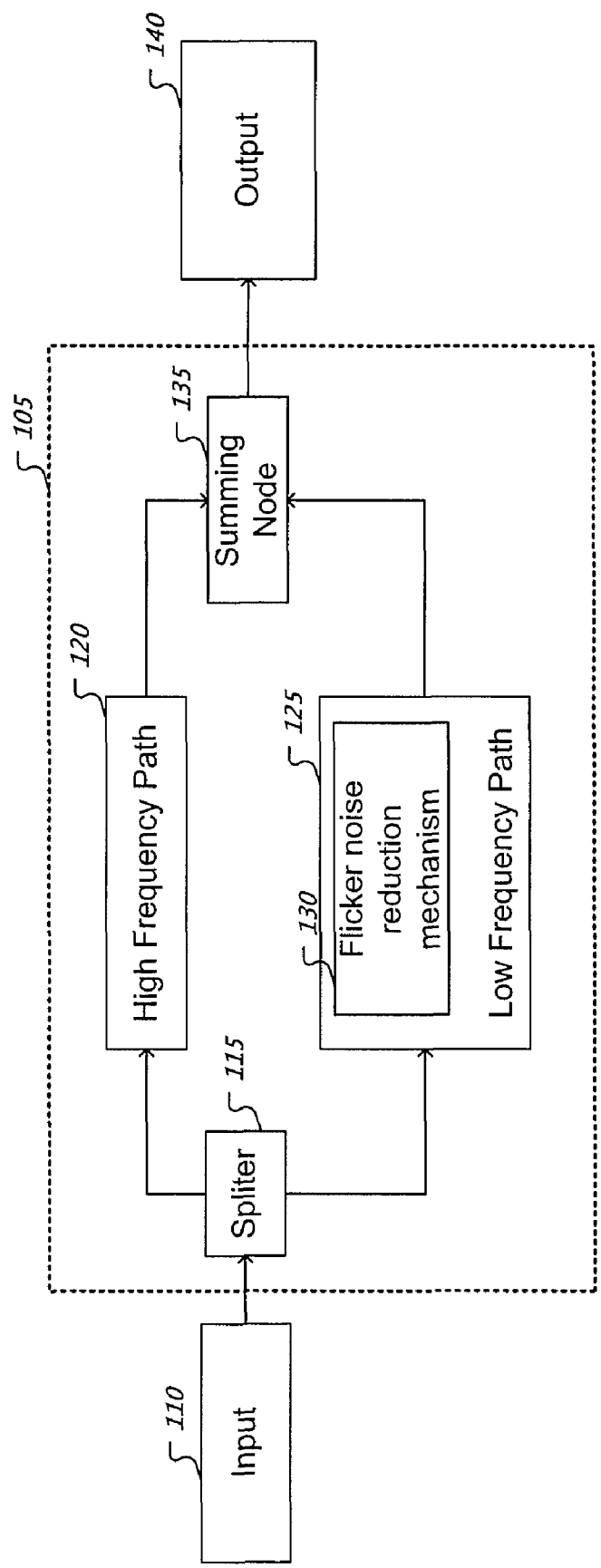
FIG. 1 shows an example of a multi-path operational amplifier circuit.

Amplifier offset and flicker noise can corrupt signal content located at low frequencies. In continuous-time applications, a chopper stabilization technique can be used to reduce the impact of offset and flicker noise. The chopper stabilization technique can include chopping a signal at a chopping frequency ($f_{chop}$) using a first chopper to up-convert the signal and a second chopper to down-convert the up-converted signal. The chopper stabilization technique can be characterized by a frequency modulation where signal content is up-converted to a chopping frequency, flicker noise and offset are added through amplifiers, and signal content is down-converted back to the signal content's original frequency which can be zero, e.g., DC. While the down-conversion process can convert the up-converted signal band back to DC, the down-conversion process can up-covert the offset and flicker noise up to $f_{chop}$.

The up-converted offset and flicker noise can be removed by a low-pass filter (LPF). An ideal LPF would impose a chopping frequency higher than the signal bandwidth so that all of the desired signal bandwidth can pass through the filter. However, using a higher chopping frequency may not be feasible because of increased power consumption and other non-ideal affects that grow with increasing chopping frequency. Thus, in cases where the signal includes desired content that a LPF would filter, a by-pass for such higher frequency components can be added. An amplifier including such a by-pass can include a low-frequency (LF) path that provides high gain and reduced flicker noise and a high-frequency (HF) path that provides increased bandwidth while bypassing the LPF on the LF path. The flicker noise of the HF path can be suppressed by the higher gain on the LF path. The LF path can include a first chopper to up-convert the signal and a second chopper to down-convert the signal.

If the signal content includes an image band component centered around two times the chopping frequency, then aliasing can occur in a LF path that only uses two choppers that are both driven by a single chopping frequency. In such a LF path, the image band can become superimposed on the desired input signal after passing through the first chopper. The frequency of the superimposed signal is located at $+/-f_{chop}$. After passing through the second chopper, the frequency of the superimposed signal shifts to $+/-2f_{chop}$ and zero.

To analyze the aliasing problem occurring in an implementation consisting of two choppers, consider a desired input signal at DC and an undesired input signal whose frequency band is around twice the chopping frequency. Due to the first chopper in the low-frequency path, the undesired signal will be aliased to $+/-f_{chop}$ in the output of the first chopper. The desired input signal will be centered around $+/-f_{chop}$ as well after the up-conversion—thereby corrupting the desired input signal. The output from the first chopper, containing the desired input signal plus undesired signal, will be down-converted to DC by the second chopper. The output of the second chopper will also include a signal at $2*f_{chop}$, but this signal can be filtered by using a LPF. The aliasing of the undesired component at $+/-2f_{chop}$ is not seen by the HF path. However, as the aliased undesired component at DC is amplified by a high gain factor through the low-frequency path, the aliased undesired component cannot be suppressed at a summing node, where the low-frequency path output is summed with the high-frequency path output.

This disclosure presents multi-path amplifier technologies that can include two low-frequency paths. Each of the low-frequency paths can include two choppers. Each pair of choppers can be driven by chopping signals centered around $f_{chop}$. However, the chopping signal driving one of the chopper pairs can be phase shifted by 90 degrees from the chopping signal driving the other chopper pair. By driving the choppers of each path differently, the output of the chopper pairs can produce different signals that, when subtracted, can attenuate or remove the aliased undesired component at DC.

FIG. 1 shows an example of a multi-path operational amplifier circuit. A multi-path operational amplifier circuit 105 can receive an input signal through an input 110 and produce an output signal through output 140. A signal splitter 115 can be used to split the input 110 into multiple paths. The paths can include a high frequency path 120 and a low frequency path 125. In some implementations, the input 110 can be directly applied to each path without the need of splitter 115. The high frequency path 120 can include an amplifier to amplify a signal from the splitter 115. The low frequency path 125 can include a flicker noise reduction mechanism 130. The flicker noise reduction mechanism 130 can include an image band rejection mechanism. The low frequency path 125 can include signal choppers interleaved with one or more amplifiers. The output signals from the low frequency path 125 and high frequency path 120 can be combined in a summing node 135 to produce an output signal through output 140. The architecture of amplifier circuit 105 can be applied to continuous-time amplifiers including, but not limited to, wideband amplifiers.

Figure 2:
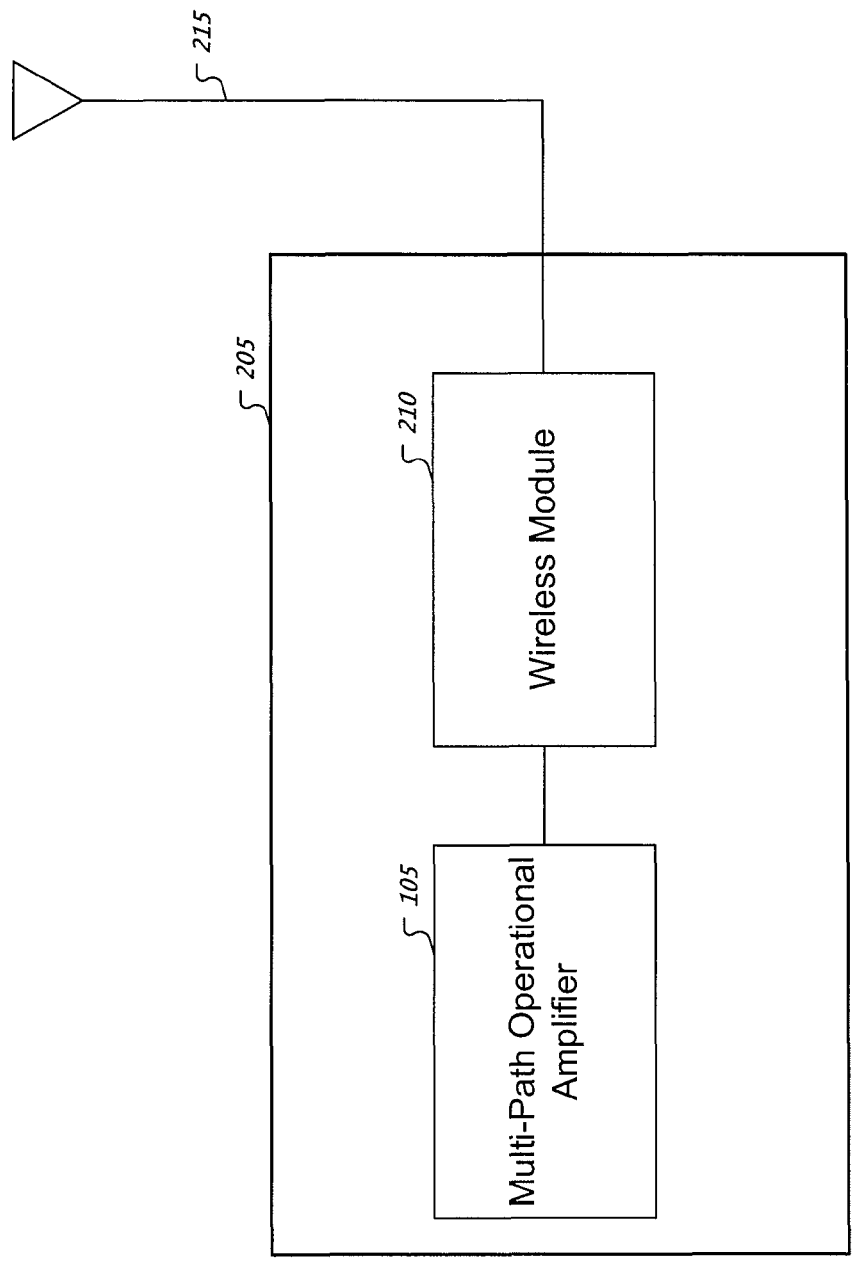
FIG. 2 shows an example of a multi-path operational amplifier circuit in a wireless device.

FIG. 2 shows an example of a multi-path operational amplifier circuit in a wireless device. The multi-path operational amplifier circuit 105 can be used in a wireless device 205 that includes a wireless module 210. The wireless module 210 can include circuitry to generate a wireless signal and process a received signal. In some implementations, the amplifier circuit 105 can be integrated with the wireless module 210. In some other implementations, the amplifier circuit 105 can be a standalone component with respect to the wireless module 210. The wireless device 205 can use one or more amplifier circuits 105. In some implementation, the amplifier circuit 105 can be used to detect a signal received over a signal interface such as antenna 215 or a connector that connects with a cable. In some implementations, the amplifier circuit 105 can be used to produce a signal for transmission on a signal interface such as antenna 215 or a connector that connects with a cable. The wireless device 205 can be any type of wireless device, e.g., a cellular phone, a personal digital assistant (PDA), a gaming device or controller, a remote control, a laptop computer, a digital camera, or the like. Techniques of the present disclosure may also be applicable to wired devices including a wireless module.

Figure 3:
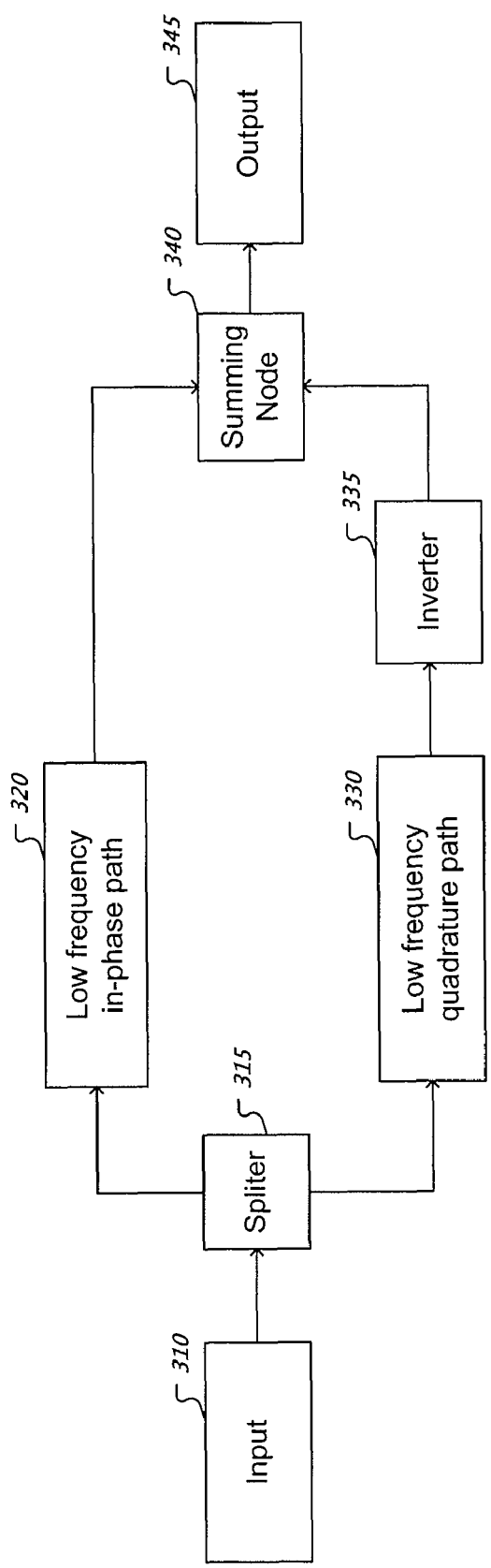
FIG. 3 shows an example of an amplifier circuit with low frequency paths.

FIG. 3 shows an example of an amplifier circuit with low frequency paths. The input 310 can be the input signal into splitter 115. The input 310 can be split via splitter 315 into a signal for the low frequency I (in-phase) path 320 and the low frequency Q (quadrature) path 330. In some implementations, the input 310 can be directly applied to each path 320, 330 without the need of splitter 315. Each path 320, 330 can include choppers interleaved with one or more amplifiers. The choppers of the I path 320 can be driven by a first, in-phase, chopping signal at a chopping frequency. The choppers of the Q path 330 can be driven by a second, quadrature phase, chopping signal at the chopping frequency. Thus, the first and second chopping signals can differ in their phase. The output from the Q path 330 is inverted by an inverter 335 before being summed with the output from the I path 320 in a summing node 340 to produce an output signal through output 345.

Figure 4:
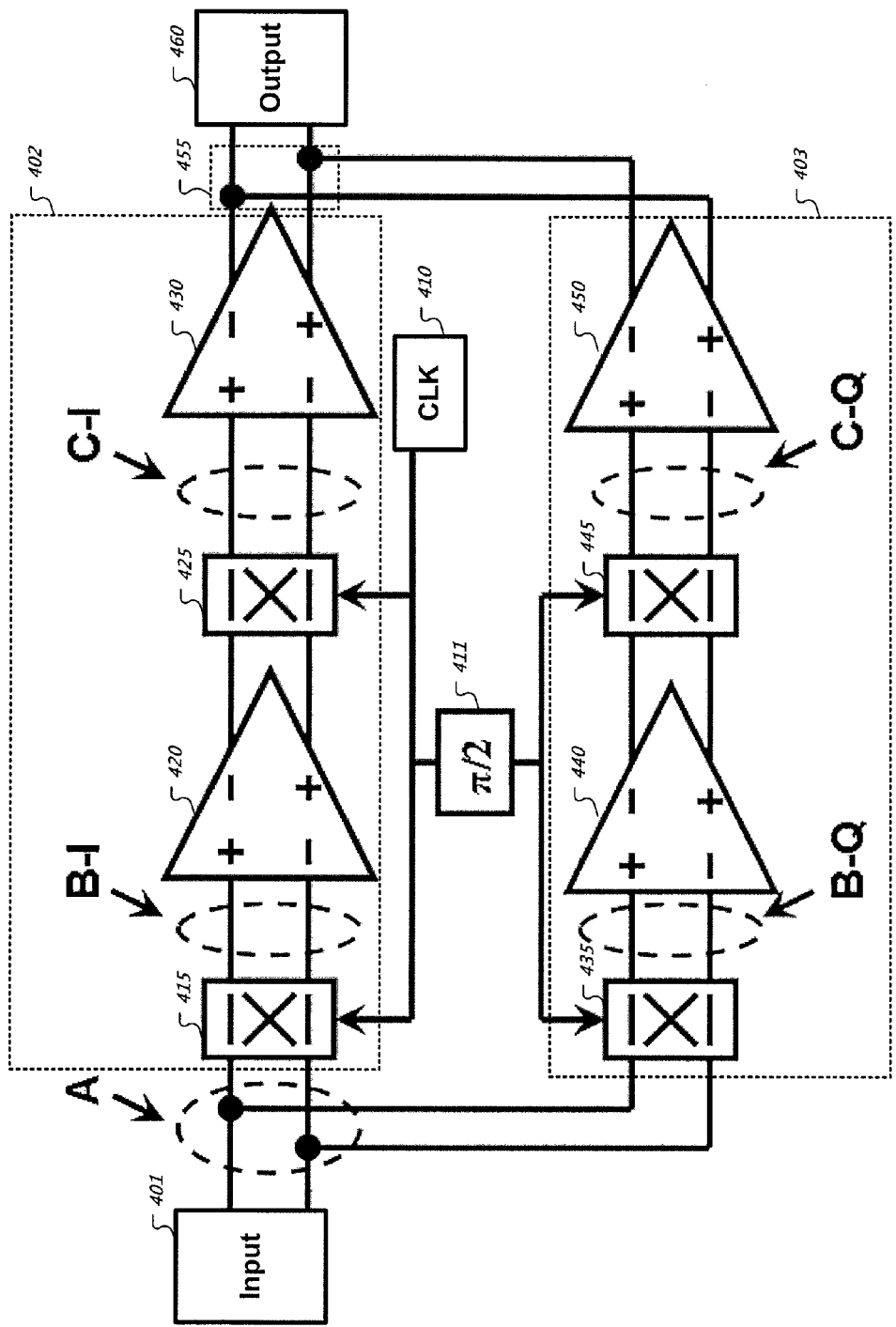
FIG. 4 shows an example of two high-gain low-frequency paths chopped by quadrature chopping signals within an amplifier circuit.

FIG. 4 shows an example of two high-gain low-frequency paths chopped by quadrature chopping signals within an amplifier circuit. An input 401 can provide an input waveform to both an in-phase I-path 402 and a quadrature Q-path 403. The I-path 402 can include choppers 415, 425 interleaved with amplifiers 420, 430. The Q-path 403 can include choppers 435, 445 interleaved with amplifiers 440, 450. A signal generator 410, such as a clock signal generator, can supply a signal at a chopping frequency $f_{chop}$ to choppers 415, 425 and a phase-shifting unit 411. The phase-shifting unit 411 can deliver a quadrature ($\pi/2$) phase-shifted version of the signal from signal generator 410 to choppers 435, 445. In some implementations, the functionality of the phase-shifting unit 411 can be incorporated into the signal generator 410 to produce separate in-phase and quadrature phase signals.

Summing node 455 can continuously sum the output from the I-path 402 and Q-path 403 to produce an output signal through output 460. The output from the amplifier 450 is inverted when arriving at the summing node 455 because a positive output of the amplifier 450 is summed with a negative output of the amplifier 430 and a negative output of the amplifier 450 is summed with a positive output of the amplifier 430. The sum computed at the output of the I-path 402 and Q-path 403 rejects the image frequency components of the chopped paths 402, 403. Image rejection can be characterized by the I-path 402 to the Q-path 403 phase and gain matching. Gain matching can be characterized by the gain matching between amplifiers 420, 440 and amplifiers 430, 450. A low-pass filter (LPF) can be inserted before, after, or embedded within amplifiers 430, 450.

Because of a phase shift between the I-path 402 and Q-path 403 chopper signals, the chopper signals within the I-path 402 can be characterized by a multiple of a cosine function while the chopper signals within the Q-path 403 can be characterized by a multiple of a sine function. At summing node 455, when summing the output of I-path 402 and an inverted output of Q-path 403, the desired frequency bands can add with the same sign, while the image band components have opposite signs and therefore cancel. This can result in a chopper stabilization technique where only one sideband of the chopping signal is effective.

Figure 5:
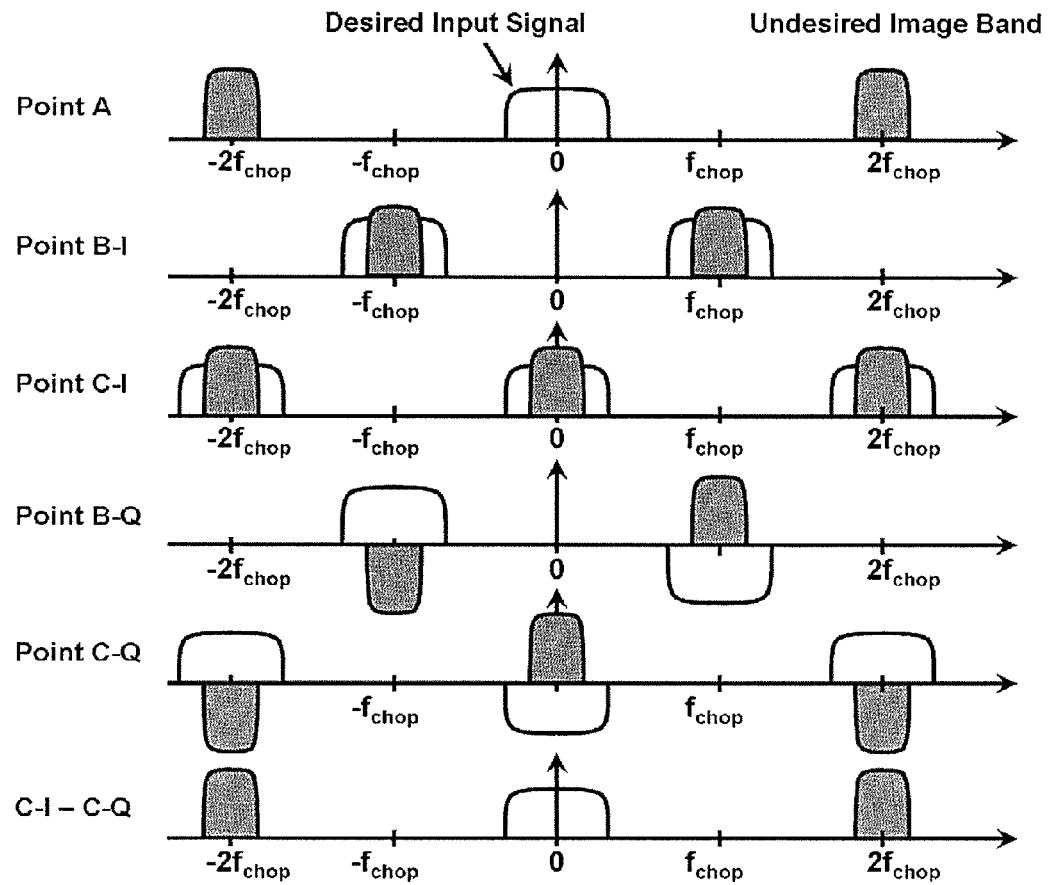
FIG. 5 shows waveform examples in frequency space that correspond to points within the amplifier circuit of FIG. 4.

FIG. 5 shows waveform examples in frequency space that correspond to points within the amplifier circuit of FIG. 4. The graph labels of FIG. 5 correspond to the appropriate labels in FIG. 4. The graphs of FIG. 5 have the x-axis as frequency and the y-axis as amplitude. The amplitudes of the graphs are not drawn to scale. Graph "Point A" shows an example of an input waveform in frequency space that corresponds to label A in FIG. 4. The input waveform can include an input component such as a desired input signal and image band components located at $+/-2f_{chop}$. Graph "Point B-I" shows an example of an output of chopper 415 after chopping the input waveform of graph "Point A" in which the image band components have shifted to $+/-f_{chop}$ in combination with a similarly shifted version of the input component. Graph "Point C-I" shows an example of an output of chopper 425 after chopping a version of the waveform shown in graph "Point B-I" in which the combination of the image band components and the input component are shifted to the zeroth frequency, i.e., D.C., and $+/-2f_{chop}$.

Graph "Point B-Q" shows an example of an output of chopper 435 after chopping the input waveform of graph "Point A" in which the image band components have shifted to $+/-$fchop in addition with a shifted version of the input component. However, as graph "Point B-Q" shows, amplitudes of the shifted components differ when compared to graph "Point B-I." Graph "Point C-Q" shows an example of an output of chopper 445 after chopping a version of the waveform shown in graph "Point B-Q" in which the combination of the image band components and the input component are shifted to the zeroth frequency and $+/-2f_{chop}$. However, as graph "Point C-Q" shows, amplitudes of the shifted components differ when compared to graph "Point C-I.".

Graph "C-I-C-Q" shows an example of the output of summing node 455 where a version of the waveform shown in graph "Point C-I" has been added with an inverted version of the waveform shown in graph "Point C-Q." This summation cancels the shifted image band components at the zeroth frequency and amplifies the desired input signal component. Further, the desired input signal shifted to $+/-2f_{chop}$ cancels in the summation leaving the images bands at $+/-2f_{chop}$.

Figure 6:
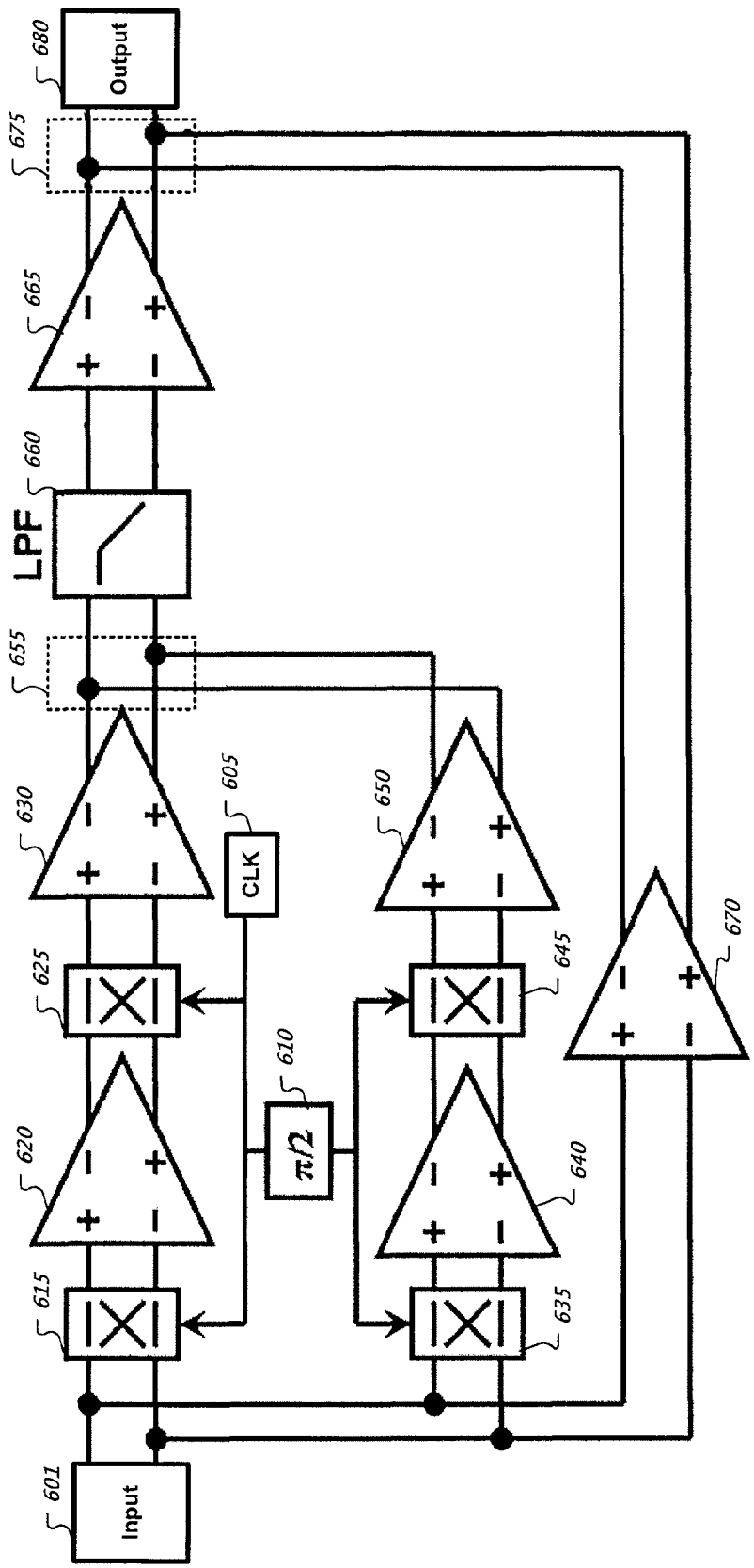
FIG. 6 shows an example of a multi-path operational amplifier circuit.

FIG. 6 shows an example of a multi-path operational amplifier circuit. An input 601 can provide an input waveform to a low frequency in-phase path and a low frequency quadrature path within the multi-path operational amplifier. A signal generator such as a clock signal generator 605 can supply a signal at a chopping frequency $f_{chop}$ to a phase-shifting unit 610 and choppers of the in-phase path such as choppers 615, 625. The phase-shifting unit 610 can deliver a quadrature phase-shifted version of the signal from signal generator 605 to choppers of the quadrature path such as choppers 635, 645. The in-phase path can include amplifiers 620, 630 interleaved with choppers 615, 625. The quadrature path can include amplifiers 640, 650 interleaved with choppers 635, 645.

Summing node 655 can continuously sum the output from amplifiers 630, 650. The output from the amplifier 650 is inverted when arriving at the summing node 655 because a positive output of the amplifier 650 is summed with a negative output of the amplifier 630 and a negative output of the amplifier 650 is summed with a positive output of the amplifier 630. A low-pass filter (LPF) 660 can filter high frequency components while allowing low frequency components to pass through LPF 660. The output from LPF 660 can be amplified by amplifier 665. In general, the LPF 660 can be inserted before, after, or embedded within amplifiers 630, 650. In some implementations, amplifiers 630, 650 can be replaced with a single amplifier placed after or before the LPF 660.

The input 601 can provide an input waveform to a high frequency path. The high frequency path can provide a route around the low frequency paths to circumvent the bandwidth-chopping frequency trade-off described earlier. The high frequency path can include amplifier 670. The output from amplifier 670 and amplifier 665 can be summed at summing node 675 to produce an output signal through output 680. In some alternate implementations, the output from amplifier 670 can be summed with the output from LPF 660 before being amplified by amplifier 665. In additional alternate implementations, the output from amplifier 670 can be summed with the output from LPF 660 and amplifier 665 can be omitted.

Figure 7:
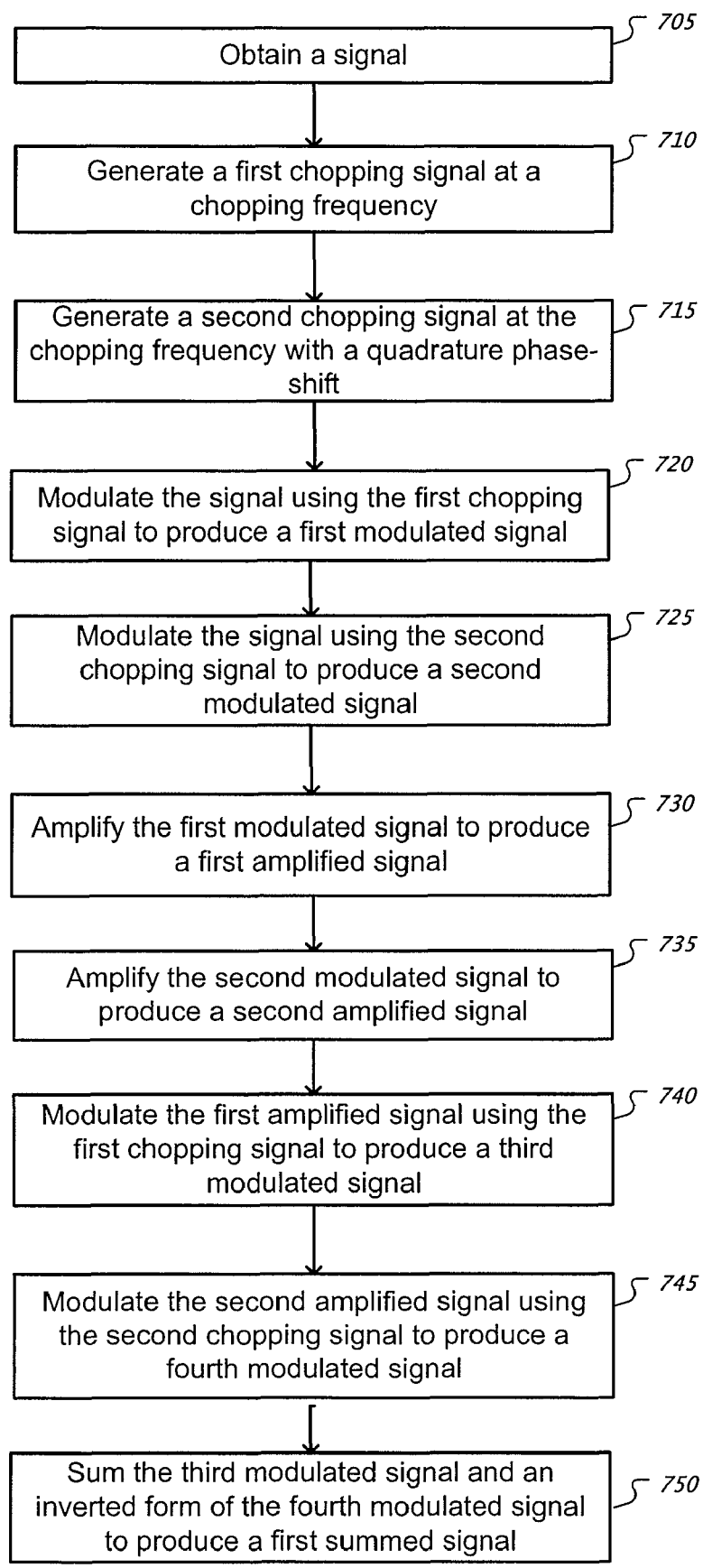
FIG. 7 shows example signal processing operations.

FIG. 7 shows example signal processing operations. An amplifier circuit can obtain 705 a signal. In some implementations, the signal can be received over the air. In some other implementations, the signal can be generated within a wireless module. The amplifier circuit can generate 710 a first chopping signal at a chopping frequency and generate 715 a second chopping signal at the chopping frequency with a quadrature phase-shift. In some implementations, the generation of the chopping signals can occur in circuitry that is separate from the amplifier. The signal can be modulated 720 using the first chopping signal to produce a first modulated signal and modulated 725 using the second chopping signal to produce a second modulated signal. In some implementations, a chopper can be used for modulation such as modulations 720, 725. The first modulated signal can be amplified 730 to produce a first amplified signal. The second modulated signal can be amplified 735 to produce a second amplified signal. The amplifier circuit can modulate 740 the first amplified signal using the first chopping signal to produce a third modulated signal and modulate 745 the second amplified signal using the second chopping signal to produce a fourth modulated signal. The amplifier circuit can sum 750 the third modulated signal and an inverted form of the fourth modulated signal to produce a first summed signal.

The amplifier circuit can perform low-pass filtering by using a LPF to filter high frequencies after the summation 750 or immediately prior to the summation 750. In some implementations, the amplifier circuit can amplify both the third modulated signal and the fourth modulated signal before the summation 750 or, instead, amplify the output of summation 750. In some implementations, the amplifier circuit can amplify the obtained 705 signal and add the resulting signal to the output of the summation 750 where the LPF filtering has been performed during or before summation 750.

Standard CMOS technologies can be used to implement and manufacture the amplifiers described in this disclosure. Other technologies, such as GaAs or BiCMOS using silicon or SiGe, can also be used to implement and manufacture the amplifiers described in this disclosure. The amplifiers described herein can be integrated with additional components or can be in a standalone package.

In environments where the overall input band is large, but the desired signal band is sufficiently lower than $f_{chop}$, the desired input signal should not be attenuated by the LPF. Thus, a multi-path amplifier for such environment can be implemented using an architecture such as the one shown in FIG. 4 without the need for a high frequency path.

In environments where the overall input band is large and the desired signal band includes both low and high frequency components, the desired high frequency component(s) can be attenuated by a LPF. The starting attenuation frequency of a LPF can be selected to provide sufficient attenuation to remove up-converted offset and flicker noise components at $f_{chop}$. In some implementations, it can be desirable to use a low-order LPF, which can have a cut-off or attenuation frequency sufficiently lower than $f_{chop}$, e.g., $f_{chop}/10$. In these environments, the desired high frequency component(s) can extend beyond the attenuation or cut-off frequency. A multi-path amplifier for these environments can be implemented using an architecture such as the one shown in FIG. 6 that includes a high-frequency path that bypasses the LPF.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

What is claimed is:
1. An amplifier circuit comprising:
a high frequency path;
a low frequency path, wherein the low frequency path comprises a flicker noise reduction mechanism including an image band rejection mechanism; and
a summing node to sum an output from the high frequency path with an output from the low frequency path, wherein the low frequency path comprises:
an in-phase path comprising a first amplifier, a first chopper, and a second chopper, wherein the first amplifier is coupled between the first chopper and the second chopper, wherein the first and second choppers use a first chopping signal; and
a quadrature path comprising a second amplifier, a third chopper, and a fourth chopper, wherein the second amplifier is coupled between the third chopper and the fourth chopper, wherein the third and fourth choppers use a second chopping signal that differs from the first chopping signal by a quadrature phase shift.

2. The amplifier circuit of claim 1, wherein the low frequency path comprises a low-pass filter.

3. The amplifier circuit of claim 2, wherein the high frequency path comprises a third amplifier.

4. An amplifier circuit comprising:
a signal generator that produces a first chopping signal at a chopping frequency and produces a second chopping signal at the chopping frequency with a quadrature phase-shift;
a first chopper unit that modulates an input signal using the first chopping signal to produce an output;
a first amplifier unit that amplifies the output of the first chopper unit to produce an output;
a second chopper unit that modulates the input signal using the second chopping signal to produce an output;
a second amplifier unit that amplifies the output of the second chopper unit to produce an output;
a third chopper unit that modulates the output of the first amplifier unit using the first chopping signal to produce an output;
a third amplifier unit that amplifies the output of the third chopper unit to produce an output;
a fourth chopper unit that modulates the output of the second amplifier unit using the second chopping signal to produce an output;
a fourth amplifier unit that amplifies the output of the fourth chopper unit to produce an output; and
a first summing node that sums the output of the third amplifier with an inverted form of the output of the fourth amplifier unit.

5. The amplifier circuit of claim 4, comprising:
a fifth amplifier unit that amplifies the input signal to produce an output; and
a second summing node responsive to the output of the fifth amplifier unit and an output coupled with the first summing node.

6. The amplifier circuit of claim 5, comprising:
a low pass filter that attenuates frequencies that are at or above an attenuation frequency, wherein the low pass filter is coupled between the first and second summing nodes; and
a sixth amplifier unit coupled between the first and second summing nodes.

7. The amplifier circuit of claim 6, wherein the low pass filter is coupled between the first summing node and the sixth amplifier unit.

8. The amplifier circuit of claim 6, wherein the low pass filter is integrated into the third amplifier and the fourth amplifier.

9. A wireless system comprising:
a signal interface;
a wireless module in communication with the signal interface; and
an amplifier circuit in communication with the wireless module, wherein the amplifier circuit comprises:
a high frequency path;
a low frequency path, wherein the low frequency path comprises a flicker noise reduction mechanism including an image band rejection mechanism; and
a summing node to sum an output from the high frequency path with an output from the low frequency path,
wherein the low frequency path comprises:
an in-phase path comprising a first amplifier, a first chopper, and a second chopper, wherein the first amplifier is coupled between the first chopper and the second chopper, wherein the first and second choppers use a first chopping signal; and
a quadrature path comprising a second amplifier, a third chopper, and a fourth chopper, wherein the second amplifier is coupled between the third chopper and the fourth chopper, wherein the third and fourth choppers use a second chopping signal that differs from the first chopping signal by a quadrature phase shift.

10. The wireless system of claim 9, wherein the low frequency path comprises a low-pass filter.

11. The wireless system of claim 10, wherein the high frequency path comprises a third amplifier.

12. The wireless system of claim 10, wherein the amplifier circuit is coupled between the signal interface and the wireless module, wherein the amplifier circuit amplifies a signal received over the signal interface.

13. The wireless system of claim 12, wherein the amplifier circuit is integrated with the wireless module.

14. The wireless system of claim 10, wherein an output of the amplifier circuit is used by the wireless module to transmit a signal over the signal interface.

15. The wireless system of claim 14, wherein the amplifier circuit is integrated with the wireless module.

16. A method for amplifying a signal, the method comprising:
obtaining a signal;
generating a first chopping signal at a chopping frequency;
generating a second chopping signal at the chopping frequency with a quadrature phase-shift;
modulating the signal using the first chopping signal to produce a first modulated signal;
modulating the signal using the second chopping signal to produce a second modulated signal;
amplifying the first modulated signal to produce a first amplified signal;
amplifying the second modulated signal to produce a second amplified signal;
modulating the first amplified signal using the first chopping signal to produce a third modulated signal;
modulating the second amplified signal using the second chopping signal to produce a fourth modulated signal; and
summing the third modulated signal and an inverted form of the fourth modulated signal to produce a first summed signal.

17. The method of claim 16, further comprising:
attenuating frequencies in the first summed signal that are at or above an attenuation frequency to produce a filtered signal.

18. The method of claim 17, further comprising:
amplifying the obtained signal to produce a high frequency signal; and
summing the filtered signal with the high frequency signal.

19. The method of claim 16, further comprising:
attenuating frequencies, before the summing, in the third modulated signal and the fourth modulated signal that are at or above an attenuation frequency.

20. The method of claim 19, further comprising:
amplifying the obtained signal to produce an amplified high frequency signal; and
summing the first summed signal with the amplified high frequency signal.

21. The method of claim 19, further comprising:
summing the first summed signal with the obtained signal to produce an intermediate signal; and
amplifying the intermediate signal.

* * * * *